United States Patent [19]

Miyamoto

[11] Patent Number: 5,164,621
[45] Date of Patent: Nov. 17, 1992

[54] DELAY DEVICE INCLUDING GENERATOR COMPENSATING FOR POWER SUPPLY FLUCTUATIONS

[75] Inventor: Takayuki Miyamoto, Hyogo, Japan

[73] Assignee: Mitsubishi Denki Kabushiki Kaisha, Tokyo, Japan

[21] Appl. No.: 780,501

[22] Filed: Oct. 22, 1991

[30] Foreign Application Priority Data

Nov. 6, 1990 [JP] Japan ................... 2-301466

[51] Int. Cl.[5] .................... H03K 5/13; H03K 3/01
[52] U.S. Cl. ................... 307/591; 307/601;
307/603; 307/605; 307/296.5; 307/296.8;
307/572
[58] Field of Search ........... 307/601, 603, 605, 443,
307/296.4–296.6, 296.8, 572, 591

[56] References Cited

U.S. PATENT DOCUMENTS

| | | | |
|---|---|---|---|
| 4,571,503 | 2/1986 | Tobita | 307/605 |
| 4,922,140 | 5/1990 | Gahle et al. | 307/591 |
| 5,051,630 | 9/1991 | Kogan et al. | 307/605 |
| 5,068,553 | 1/1991 | Love | 307/605 |

OTHER PUBLICATIONS

IBM Tech. Disc. Bul. vol. 25, No. 4, Sep. 1982 "CMOS Timing Generator" Craig.

Primary Examiner—Janice A. Howell
Assistant Examiner—Margaret R. Wambach
Attorney, Agent, or Firm—Lowe, Price, Le Blanc & Becker

[57] ABSTRACT

A semiconductor delay device is disclosed which allows a delay time to be fixed irrespective of a power supply voltage. The semiconductor delay device includes a first switching circuit, a second switching circuit, a capacitor an N channel transistor and a control voltage generation circuit. The first switching circuit switches in response to an input signal. The capacitor is charged and discharged in response to an output of the first switching circuit. The second switching circuit switches when a voltage level of the capacitor exceeds a fixed voltage. The control voltage generation circuit generates a voltage signal appropriately proportional to a square root of the power supply voltage and applies the generated voltage signal to a gate of an N channel transistor. The N channel transistor is connected between the first switching circuit and the source and current drivability of which is changed in response to the voltage signal. As a result, a delay time can be fixed irrespective of a power supply voltage.

17 Claims, 5 Drawing Sheets

DELAY DEVICE INCLUDING GENERATOR COMPENSATING FOR POWER SUPPLY FLUCTUATIONS

BACKGROUND OF THE INVENTION

1. Field of the Invention

The present invention relates generally to an improvement in semiconductor delay circuits formed on a semiconductor substrate.

2. Description of the Background Art

With recent advances in semiconductor technology, large scale integrated circuits (LSI) and very large scale integrate circuits (VLSI) have been developed. Such integrated circuits require precise time setting to activate a plurality of elements. In particular, a dynamic RAM (Random Access Memory) takes time from a rise of a word line until detection of an output of a bit line. It is therefore necessary to exactly set timing for activating a sense amplifier.

FIG. 5 is a block diagram of such dynamic RAM. With reference to the drawing, a memory cell array 50 of a dynamic RAM comprises a plurality of word lines WLs, a plurality of bit lines BLs for inputting/outputting data and memory cells MCs arranged at crossing points between the word lines WLs and the bit lines BLs. The dynamic RAM further comprises a row decoder 51 for activating a word line WL corresponding to an address in response to an external row address signal, a sense amplifier 54 for detecting data from a bit line BL at the time of reading, an output buffer 55 for externally transmitting an output of the sense amplifier 54, and a delay circuit 56. Each memory cell MC comprises an N channel transistor 52 having a gate connected to a word line WL and a drain connected to a bit line BL and a capacitor 53 connected between the source of the N channel transistor 52 and a ground terminal.

In operation, the row address decoder decodes a row address signal to brought a word line WL corresponding to an address to a high level (logical high). The N channel transistor 52 connected to the high level word line WL is turned on. As a result, the data stored in the capacitor 53 is externally transferred through the bit line BL, the sense amplifier 54 and the output buffer 55.

FIG. 6 is a diagram showing a time relation between a level of a word line WL and a level of a bit line BL. $T_O$ represents a time point of a rise of the word line WL, $T_l$ represents a detectable time point, $T_r$ represents a detection time point, $T_O$-$T_r$ represents a delay time period and $T_l$-$T_r$ represents a time margin. With reference to the drawing, the time period of $T_O$-$T_l$ is required from a rise of the word line WL to an appearance of output data on the bit line BL. Therefore, low level (logical low) data might be detected when the sense amplifier 54 is activated at the time point $T_O$. Thus, the sense amplifier should be activated after a lapse of the time period $T_l$. In addition, too large a delay time $(T_o$-$T_r)$ reduces a read rate. It is therefore necessary to precisely set a delay time.

FIG. 7 is a circuit diagram of a delay circuit. With reference to the drawing, a delay circuit 56 comprises an input terminal 5 connected to a word line WL, an output terminal 7 connected to the sense amplifier 54, a first switching circuit A, a second switching circuit B and a capacitor 8 charged/discharged in response to an output of the first switching circuit A. The first switching circuit A comprises a P channel transistor 1 and an N channel transistor 2 each having a gate connected to the input terminal. The P channel transistor 1 has a source connected to a power supply voltage Vcc and a drain connected to a node 6. The N channel transistor 2 has a drain connected to the node 6 and a source grounded. The second switching circuit B comprises a P channel transistor 3 and an N channel transistor 4 each having a gate connected to the node 6. The P channel transistor 3 has a source connected to the power supply Vcc and a drain connected to the output terminal 7. The N channel transistor 4 has a drain connected to the output terminal 7 and a source grounded. The capacitor 8 is connected between the node 6 and the ground terminal.

FIG. 8 is a timing chart of the delay circuit shown in FIG. 7 wherein Vi represents a voltage level of a word line WL, Vn represents a voltage signal of the node 6 and Vout represents a voltage signal of the output terminal 7. Operation of the delay circuit will be described with reference to FIGS. 7 and 8. First, when the input signal Vi attains a high level, the P channel transistor 1 turns off and the N channel transistor 2 turns on. As a result, the electric charges stored in the capacitor 8 are discharged to gradually reduce the potential at the node 6. Then, after a lapse of a fixed time td, the P channel transistor 3 and the N channel transistor 4 attain a threshold voltage $V_{TH}$. When the voltages of the transistors become lower than the threshold voltage $V_{TH}$ (at $T_l$), the P channel transistor 3 is turned on and the N channel transistor 4 is turned off. As a result, a high level signal is obtained at the output terminal 7. The high level signal is applied to the sense amplifier 54 to activate the same. The data in the memory cell MC is detected.

However, in the delay circuit shown in FIG. 7, the delay time td is changed with a fluctuation of the power supply voltage Vcc. The change in the delay time td is followed by a fluctuation in timing for activating the sense amplifier 54. Such state will be described with reference to FIG. 9.

FIG. 9 is a graph showing a relation between the delay time td and the power supply voltage Vcc. With reference to the drawing, the delay time td is inversely proportional to the power supply voltage Vcc. That is, as the power supply voltage Vcc increases, the delay time td is shortened. This is because the on-resistance of the N channel transistor 2 is reduced as the power supply voltage Vcc increases to increase a high level of an input signal (a level of a word line).

SUMMARY OF THE INVENTION

An object of the present invention is to delay an input signal by a fixed time period in a semiconductor delay device irrespective of fluctuations in a power supply voltage.

Another object of the present invention is to make sense timing fixed in a dynamic RAM.

Briefly stated, the present invention is directed to a delay device formed on a semiconductor substrate, which device includes a first switching device, a second switching device, a capacitor, a control voltage generation device and an N channel transistor. The first switching circuit is switched in response to an input signal proportional to a power supply voltage level. The capacitor has one end connected to the output of the first switching device and the other end grounded. The second switching device is connected to one end of the capacitor and is switched when a voltage level of the capacitor exceeds a fixed voltage. The control voltage generation device generates a voltage signal approximately proportional to a square root of a power supply voltage in response to a change of the power supply voltage. The N channel transistor has a drain and a source connected to the source of the first switching device and the ground terminal, respectively, and a gate connected to the control voltage generation device. Current drivability of the N channel transistor is changed in response to a voltage signal from the control voltage generation device.

In operation, the control voltage generation device generates a voltage signal proportional to about a square root of a power supply voltage, which voltage signal is applied to the gate of the N channel transistor to change the current drivability of the N channel transistor. As a result, a delay time can be fixed irrespective of a change of a power supply voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
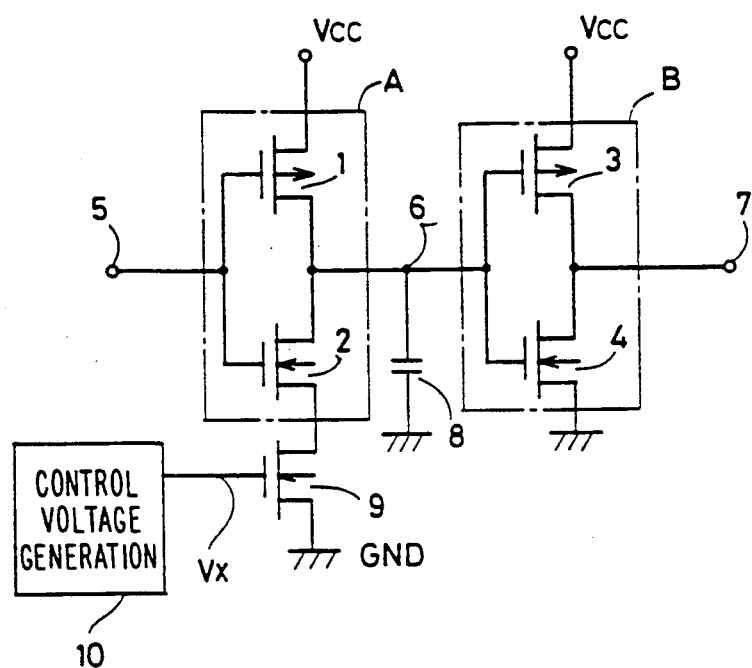
FIG. 1 is a circuit diagram showing one embodiment of the present invention.
Figure 7:
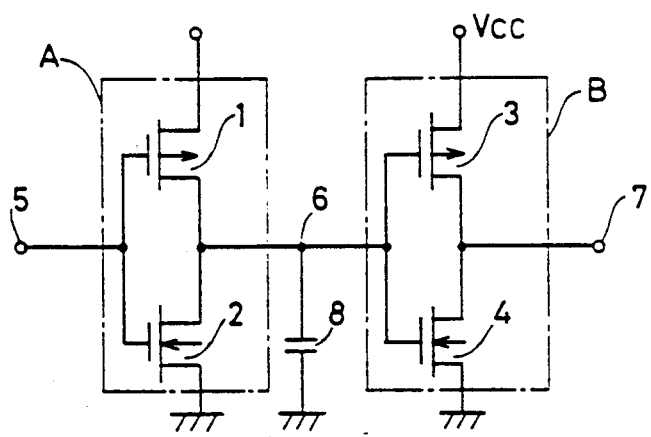
FIG. 7 is a circuit diagram showing a conventional delay circuit for use in a dynamic RAM.
Figure 8:
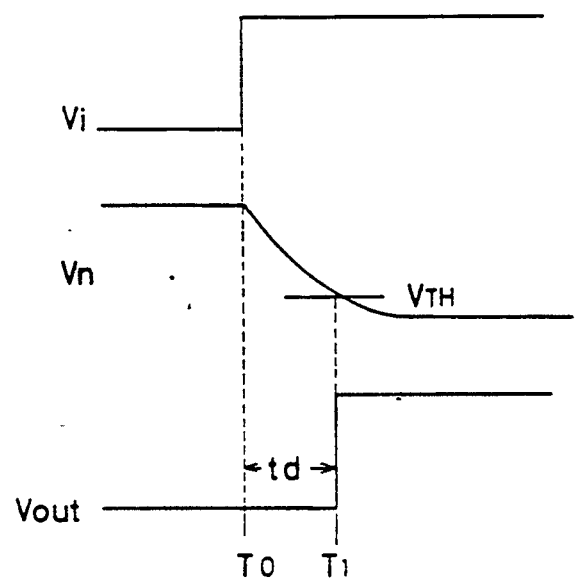
FIG. 8 is a timing chart of the delay circuit shown in FIG. 7.
Figure 9:
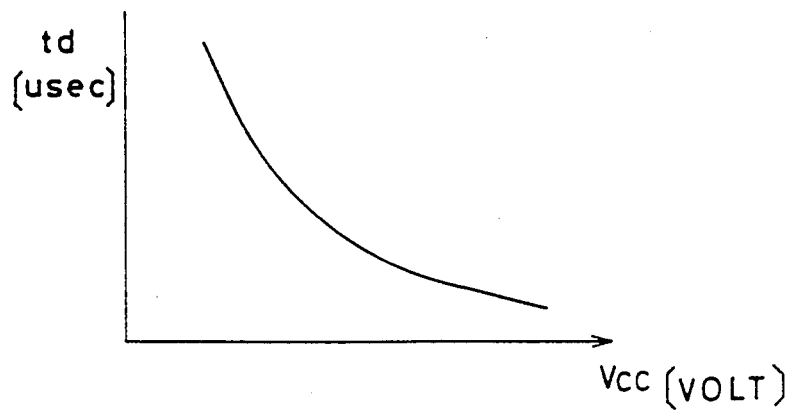
FIG. 9 is a graph showing a relation between a delay time and a power supply voltage of the delay circuit.

FIG. 1 is a circuit diagram showing one embodiment of the present invention. The same reference numerals are allotted to the same portions as those in the prior art of FIG. 7 and description thereof is omitted. With reference to FIG. 1, the present embodiment differs from that of FIG. 7 in that it comprises an N channel transistor 9 provided between the source of the N channel transistor 2 and ground and a control voltage generation circuit 10 connected to the gate of the N channel transistor 9. The control voltage generation circuit 10 generates a voltage Vx in approximately proportional to a square root of a power supply voltage Vcc of the N channel transistor 9. The N channel transistor 9 has current drivability sufficiently smaller than that of the N channel transistor 2. This current drivability is set by varying a channel length and a channel width. With the current drivability being varied, a delay time is determined by a value of the capacitor 8 and the current drivability of the N channel transistor 9. That is, it is possible to reduce an effect of the on-resistance of the N channel transistor 2.

Herein, current drivability is represented as drain current Id in a saturation region and is expressed by the following equation.

$$I_d = \frac{\beta}{2}(V_G - V_H)^2 \quad (1)$$

wherein $\beta$ denotes a constant for an MOS structure which is substantially proportional to a channel length L/ a channel width W.

Figure 2:
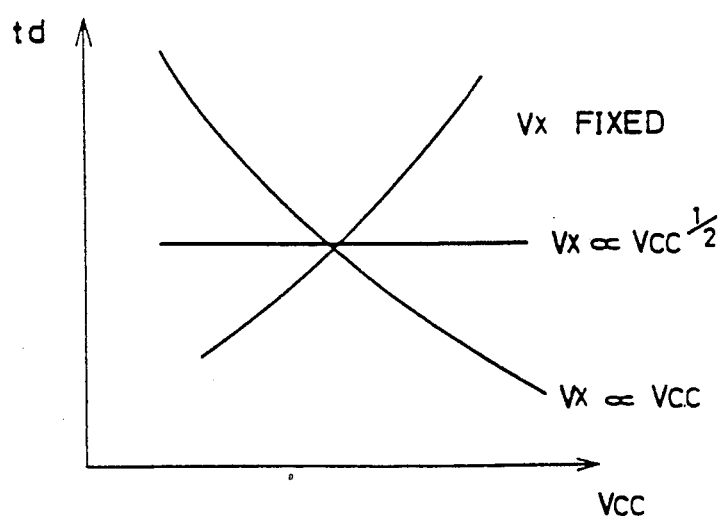
FIG. 2 is a graph showing a relation between a delay time and a power supply voltage when a control voltage is changed.

FIG. 2 is a graph showing a relation between a delay time td and a power supply voltage Vcc when a control voltage Vx is changed. With reference to the drawing, when the control voltage Vx is proportional to Vcc, the delay time td is reduced in inversely proportional to Vcc as in the prior art. When the control voltage Vx is fixed, the delay time td is increased in proportional to the power supply voltage Vcc. This is because the electric charges stored in the capacitor 8 are increased in proportion to Vcc. It is also found that when the control voltage Vx is approximately proportional to a square root of Vcc, a fixed delay time can be obtained irrespective of a change of the power supply voltage.

The foregoing state will be expressed by the following equation.

$$td \propto \frac{C \times Vcc}{\frac{\beta}{2}(Vx - V_{TH})^2} \quad (2)$$

Neglecting the threshold voltage $V_{TH}$, the following equation can be obtained.

$$td \propto \frac{Vcc}{Vx^2} \quad (3)$$

That is, when Vx α Vcc . . . td α1/Vcc
when Vx is fixed . . . td α Vcc
when Vx α Vcc$\frac{1}{2}$ . . . td is fixed.

Figure 3:
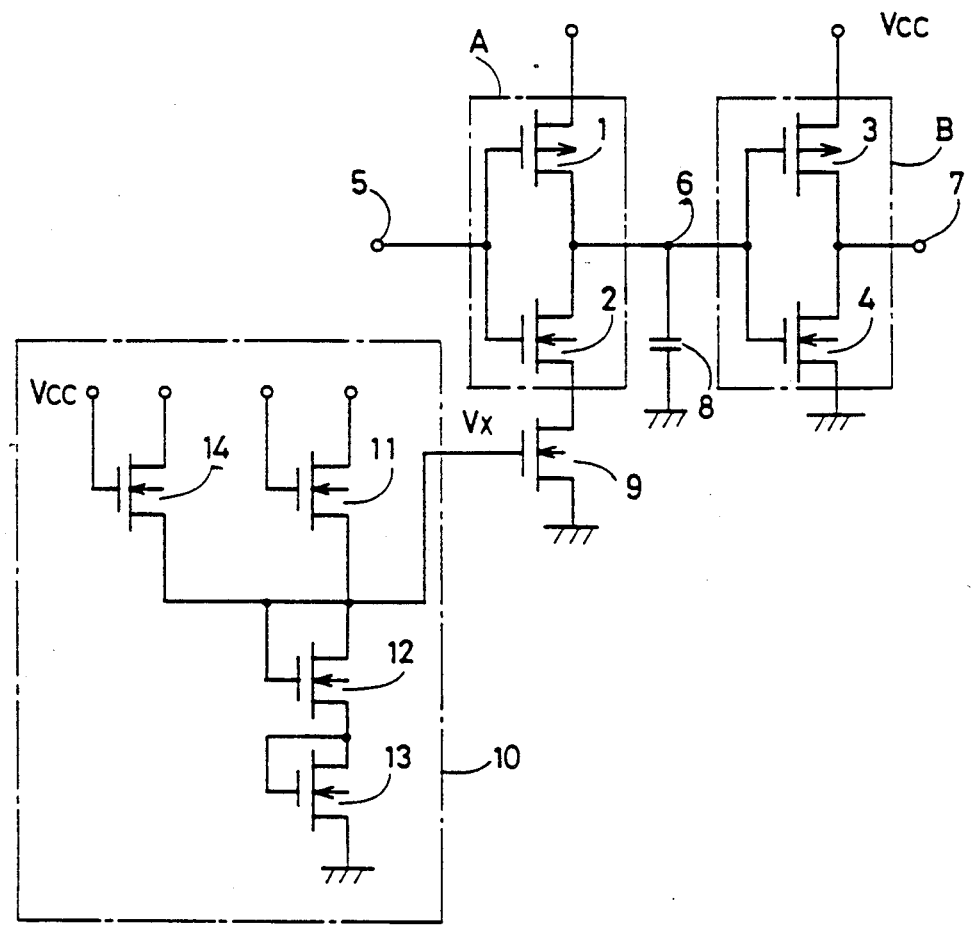
FIG. 3 is a circuit diagram showing a first delay circuit in detail.

FIG. 3 is a circuit diagram showing the delay circuit of FIG. 1 in detail. With reference to the drawing, the control voltage generation circuit 10 of the delay circuit comprises a first N channel transistor 14, a second N channel transistor 11, a third N channel transistor 12 and a fourth N channel transistor 13. The gate of the first N channel transistor 14 and the drain of the second N channel transistor 11 are connected to the power supply voltage Vcc and the sources of both the transistors are connected to the gate of the N channel transistor 9. The third N channel transistor 12 has a gate and a drain connected to the gate of the N channel transistor 9 and 12 has a source connected to the drain and the gate of the fourth N channel transistor 13. The source of the N channel transistor 13 is grounded. The second to the fourth N channel transistors 11, 12 and 13 have the same threshold voltage. The first N channel transistor 14 has a threshold voltage lower than the threshold voltage of the second to the fourth N channel transistors. The threshold voltage is determined by an ion concentration of the channel. The drivability of the first N channel transistor 14 is set sufficiently smaller than that of the second N channel transistor 11. A current drivability ratio is determined by the size of a transistor as described above.

Figure 4:
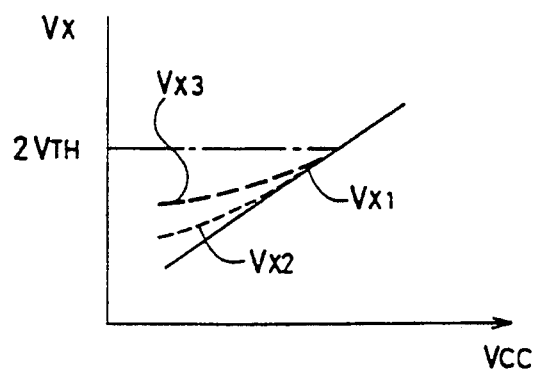
FIG. 4 is a graph showing a simulation result of a control voltage generation circuit.
Figure 5:
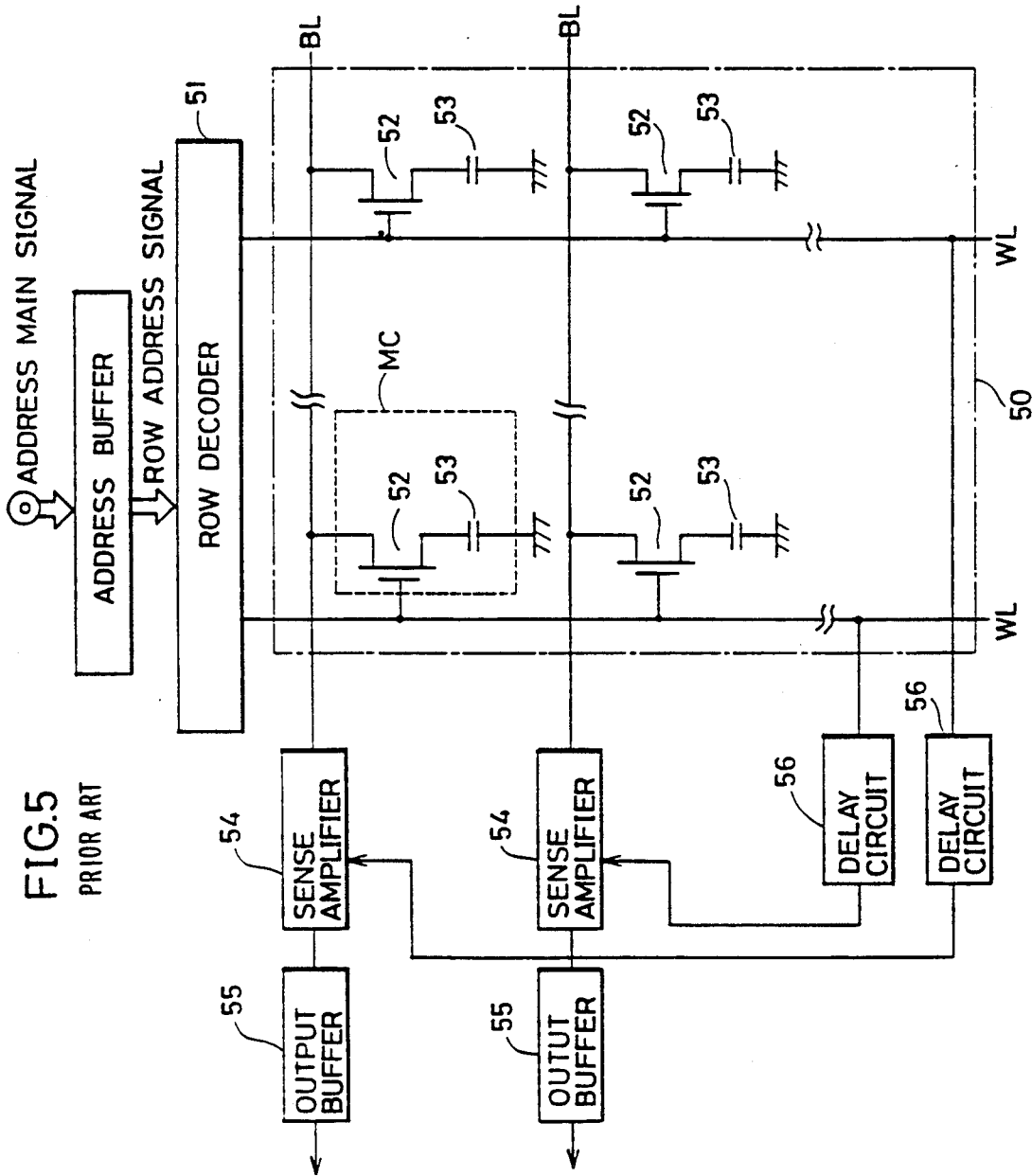
FIG. 5 is a diagram showing a memory cell array of a dynamic RAM.
Figure 6:
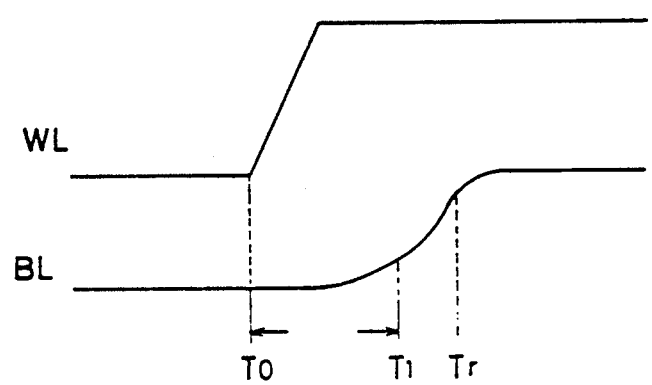
FIG. 6 is a diagram showing a time relation between a word line level and a bit line level.

FIG. 4 is a graph showing a simulation result of the control voltage generation circuit 10 shown in FIG. 3, in which the solid line Vx₁ represents a control voltage when the first N channel transistor 14 is not provided, the thin broken line $V_{x2}$ represents a source voltage of the first N channel transistor 14 and the thick broken line $V_{x3}$ represents a combined voltage of $V_{x1}$ and $V_{x2}$. With reference to the drawing, operation of said control voltage generation circuit of FIG. 3 will be described. With the first N channel transistor 14 provided, a control voltage $V_{x1}$ substantially proportional to the power supply voltage Vcc is generated. Without the first N channel transistor 14, a control voltage $V_{x3}$ proportional to a square root of the power supply voltage Vcc is generated. This is because current drivability of the first N channel transistor 14 becomes large to combine the source voltage $V_{x2}$ of the first N channel transistor 14 and the voltage $V_{x1}$ shown by the solid line when the power supply voltage Vcc is low.

While a delay circuit comprising N channel transistors is described in the above-described embodiment, P channel transistors can replace N channel transistors. In addition, although the above-described embodiment shows a delay circuit applicable to a dynamic RAM, such delay circuit can be applied to any circuit having signal input to a switching circuit A which is proportional to a power supply voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor delay device formed on a semiconductor substrate comprising:
   a power supply voltage terminal,
   a ground terminal,
   first switching means having first and second conduction terminals, and a control terminal, said first conduction terminal being connected to a power supply voltage and switching in response to a signal input to said control terminal,
   a capacitor connected between an output of said first switching means and the ground terminal,
   second switching means connected to the output of said first switching means and switching when the output of said first switching means exceeds a fixed level,
   control voltage generating means responsive to a change of the power supply voltage for generating a voltage signal approximately proportional to a square root of the power supply voltage, and
   an insulated field effect transistor having a drain connected to the second conduction terminal of said first switching means, a source connected to said ground terminal and a gate connected to said control voltage generating means, current drivability of which transistor is changed in response to said voltage signal.

2. The semiconductor delay device according to claim 1, wherein the signal input to said first switching means includes a logic signal of a word line of a dynamic random access memory.

3. The semiconductor delay device according to claim 1, wherein said first switching means includes complementary insulated field effect transistors.

4. The semiconductor delay device according to claim 1, wherein said second switching means includes complementary insulated field effect transistors.

5. The semiconductor delay device according to claim 1, wherein said insulated field effect transistor includes one insulated field effect transistor selected from either a P channel field effect transistor or an N channel field effect transistor.

6. The semiconductor delay device according to claim 3, wherein said insulated field effect transistor has current drivability set smaller than that of the complementary insulated field effect transistors of said first switching means.

7. The semiconductor delay device according to claim 1, wherein said control voltage generating means comprises:
   first and second insulated field effect transistors having drains and gates connected to the power supply voltage terminal and sources connected in common to each other,
   a third insulated field effect transistor having a drain and a gate connected to said common connection, and
   a fourth insulated field effect transistor having a drain and a gate connected to the source of the third insulated field effect transistor and a source grounded.

8. The semiconductor delay device according to claim 7, wherein said first insulated field effect transistor and said second insulated field effect transistor are set such that current drivability of the first insulated field effect transistor is smaller than current drivability of the second insulated field effect transistor.

9. The semiconductor delay device according to claim 7, wherein said first insulated field effect transistor and said second insulated field effect transistor are set such that the threshold voltage of said first insulated field effect transistor is smaller than that of said second insulated field effect transistor.

10. The semiconductor delay device according to claim 7, wherein said second, third and fourth insulated field effect transistors are set to have the same threshold voltage.

11. In a semiconductor delay device formed on a semiconductor substrate including:
   first switching means having a power supply voltage terminal, a ground terminal, first and second conduction terminals and a control terminal, said first conduction terminal being connected to a power supply voltage, and switching in response to a signal input to said control terminal,
   a capacitor connected between an output of said first switching means and the ground terminal,
   second switching means connected to the output of said first switching means and switching when the output of the first switching means exceeds a fixed level, and
   an insulated field effect transistor having a drain connected to the second conduction terminal of said first switching means and a source connected to the ground terminal,
   a method of fixing a delay time comprising the steps of:
   generating a voltage signal approximately proportional to a square root of the power supply voltage in response to a change of the power supply voltage, and
   changing current drivability of said insulated field effect transistor in response to the voltage signal generated in said step of generating.

12. A semiconductor delay device comprising:

first switching means connected to a power supply voltage and receiving an input signal;

second switching means having an input connected to an output of the first switching means;

a capacitor connected to ground and between the output of said first switching means and the input of said second switching means;

control voltage generating means responsive to a change of the power supply voltage for generating a voltage signal proportional to a root power of the power supply voltage; and third switching means connected to the first switching means and receiving the generated voltage signal of the control voltage generating means for controlling operation of said first switching means; wherein current drivability of the third switching means is changed in response to the generated voltage signal of the control voltage generating means.

13. The semiconductor delay device according to claim 12, wherein the signal input to said first switching means includes a logic signal of a word line of a dynamic random access memory.

14. The semiconductor delay device according to claim 12, wherein said first switching means includes complementary insulated field effect transistors.

15. The semiconductor delay device according to claim 14, wherein said third switching means has current drivability set smaller than that of the complementary insulated field effect transistors of said first switching means.

16. The semiconductor delay device according to claim 12, wherein said second switching means includes complementary insulated field effect transistors.

17. The semiconductor delay device according to claim 12, wherein said third switching means includes one insulated field effect transistor selected from either a P channel field effect transistor or an N channel field effect transistor.

* * * * *